United States Patent
Xia et al.

(10) Patent No.: US 7,112,541 B2
(45) Date of Patent: Sep. 26, 2006

(54) IN-SITU OXIDE CAPPING AFTER CVD LOW K DEPOSITION

(75) Inventors: Li-Qun Xia, Santa Clara, CA (US); Huiwen Xu, Sunnyvale, CA (US); Derek R. Witty, Fremont, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 166 days.

(21) Appl. No.: 10/840,754

(22) Filed: May 6, 2004

(65) Prior Publication Data

US 2005/0250348 A1   Nov. 10, 2005

(51) Int. Cl.
*H01L 21/469* (2006.01)

(52) U.S. Cl. .................. 438/771; 438/628; 438/681

(58) Field of Classification Search ................ 438/771, 438/628, 681
See application file for complete search history.

(56) References Cited

U.S. PATENT DOCUMENTS

| | | | |
|---|---|---|---|
| 3,297,501 A | 1/1967 | Reisman | |
| 3,306,501 A | 2/1967 | Keller | |
| 3,709,672 A | 1/1973 | DeSantis et al. | |
| 3,805,425 A | 4/1974 | Spoida et al. | |
| 3,926,774 A | 12/1975 | Watson et al. | |
| 4,324,845 A | 4/1982 | Stockel | |
| 4,425,963 A | 1/1984 | Scholz et al. | |
| 4,508,054 A | 4/1985 | Baumberger et al. | |
| 4,616,122 A | 10/1986 | Burian et al. | |
| 4,661,140 A | 4/1987 | Takimoto et al. | |
| 4,699,083 A | 10/1987 | Huet et al. | |
| 4,699,084 A | 10/1987 | Wilson et al. | |
| 4,699,805 A | 10/1987 | Seelbach et al. | |
| 4,836,558 A | 6/1989 | Anderson et al. | |
| 4,872,947 A | 10/1989 | Wang et al. | |
| 5,000,113 A | 3/1991 | Wang et al. | |
| 5,030,746 A | 7/1991 | Schilling, Jr. | |
| 5,055,169 A | 10/1991 | Hock, Jr. et al. | |
| 5,066,169 A | 11/1991 | Gavin et al. | |
| 5,112,442 A | 5/1992 | Goodson | |
| 5,160,543 A | 11/1992 | Ishihara et al. | |
| 5,204,314 A | 4/1993 | Kirlin et al. | |
| 5,273,588 A | 12/1993 | Foster et al. | |
| 5,336,324 A | 8/1994 | Stall et al. | |
| 5,372,754 A | 12/1994 | Ono | |
| 5,376,409 A | 12/1994 | Kaloyeros et al. | |
| 5,383,970 A | 1/1995 | Asaba et al. | |
| 5,391,232 A | 2/1995 | Kanai et al. | |
| 5,400,476 A | 3/1995 | White | |
| 5,400,603 A | 3/1995 | Bauer et al. | |

(Continued)

FOREIGN PATENT DOCUMENTS

EP     0 636 704 A1    2/1995

(Continued)

*Primary Examiner*—Matthew Smith
*Assistant Examiner*—Nicholas J. Tobergte
(74) *Attorney, Agent, or Firm*—Patterson and Sheridan

(57) ABSTRACT

A method of processing a substrate including depositing a low dielectric constant film comprising silicon, carbon, and oxygen on the substrate and depositing an oxide rich cap on the low dielectric constant film is provided. The low dielectric constant film is deposited from a gas mixture comprising an organosilicon compound and an oxidizing gas in the presence of RF power in a chamber. The RF power and a flow of the organosilicon compound and the oxidizing gas are continued in the chamber after the deposition of the low dielectric constant film at flow rates sufficient to deposit an oxide rich cap on the low dielectric constant film.

20 Claims, 4 Drawing Sheets

U.S. PATENT DOCUMENTS

| | | | |
|---|---|---|---|
| 5,419,924 | A | 5/1995 | Nagashima et al. |
| 5,421,895 | A | 6/1995 | Tsubouchi et al. |
| 5,494,101 | A | 2/1996 | Esser et al. |
| 5,527,567 | A | 6/1996 | Desu et al. |
| 5,534,068 | A | 7/1996 | Beach et al. |
| 5,558,717 | A | 9/1996 | Zhao et al. |
| 5,618,761 | A | 4/1997 | Eguchi et al. |
| 5,630,878 | A | 5/1997 | Miyamoto et al. |
| 5,656,329 | A | 8/1997 | Hampden-Smith et al. |
| 5,660,201 | A | 8/1997 | Turner |
| 5,681,613 | A | 10/1997 | Hansen |
| 5,725,675 | A | 3/1998 | Fong et al. |
| 5,728,222 | A | 3/1998 | Barbee et al. |
| 5,783,253 | A | 7/1998 | Roh |
| 5,820,641 | A | 10/1998 | Gu et al. |
| 5,834,060 | A | 11/1998 | Kawahara et al. |
| 5,835,678 | A | 11/1998 | Li et al. |
| 5,840,254 | A | 11/1998 | Carver, Jr. et al. |
| 5,855,681 | A | 1/1999 | Maydan et al. |
| 5,865,421 | A | 2/1999 | Ono |
| 5,882,411 | A | 3/1999 | Zhao et al. |
| 5,882,416 | A | 3/1999 | Van Buskirk et al. |
| 5,885,356 | A | 3/1999 | Zhao et al. |
| 5,900,060 | A | 5/1999 | Nause et al. |
| 5,906,683 | A | 5/1999 | Chen et al. |
| 5,911,834 | A | 6/1999 | Fairbairn et al. |
| 5,948,704 | A | 9/1999 | Benjamin et al. |
| 5,968,276 | A | 10/1999 | Lei et al. |
| 6,054,206 | A | 4/2000 | Mountsier |
| 6,056,823 | A | 5/2000 | Sajoto et al. |
| 6,066,209 | A | 5/2000 | Sajoto et al. |
| 6,068,884 | A | 5/2000 | Rose et al. |
| 6,077,562 | A | 6/2000 | Dornfest et al. |
| 6,140,226 | A | 10/2000 | Grill et al. |
| 6,147,009 | A | 11/2000 | Grill et al. |
| 6,159,871 | A | 12/2000 | Loboda et al. |
| 6,202,656 | B1 | 3/2001 | Schmitt |
| 6,224,681 | B1 | 5/2001 | Sivaramakrishnan et al. |
| 6,350,670 | B1 | 2/2002 | Andideh et al. |
| 6,498,898 | B1 | 12/2002 | Schmitt |
| 6,518,646 | B1 | 2/2003 | Hopper et al. |
| 6,521,302 | B1 | 2/2003 | Campana-Schmitt et al. |
| 6,527,865 | B1 | 3/2003 | Sajoto et al. |
| 6,593,247 | B1 | 7/2003 | Huang et al. |
| 6,627,532 | B1 | 9/2003 | Gaillard et al. |
| 6,656,837 | B1 * | 12/2003 | Xu et al. .................. 438/676 |
| 6,740,539 | B1 | 5/2004 | Conti et al. |
| 6,756,674 | B1 | 6/2004 | Catabay et al. |
| 6,784,119 | B1 | 8/2004 | Gaillard et al. |
| 6,849,561 | B1 | 2/2005 | Goundar |
| 6,902,440 | B1 | 6/2005 | Dougan et al. |
| 6,903,004 | B1 | 6/2005 | Spencer et al. |
| 6,903,445 | B1 | 6/2005 | Ryuzaki et al. |
| 6,913,992 | B1 * | 7/2005 | Schmitt et al. ............. 438/628 |
| 7,034,409 | B1 | 4/2006 | Xu et al. |
| 2002/0054962 | A1 | 5/2002 | Huang |
| 2003/0194495 | A1 | 10/2003 | Li et al. |
| 2003/0228769 | A1 | 12/2003 | Chen et al. |
| 2004/0076767 | A1 | 4/2004 | Satoh et al. |
| 2004/0101633 | A1 | 5/2004 | Zheng et al. |
| 2004/0155340 | A1 | 8/2004 | Owada et al. |
| 2004/0166665 | A1 | 8/2004 | Gaillard et al. |
| 2004/0169283 | A1 | 9/2004 | Baek et al. |
| 2004/0253388 | A1 | 12/2004 | Kim |
| 2005/0026422 | A1 | 2/2005 | Kim et al. |
| 2005/0051900 | A1 | 3/2005 | Liu et al. |
| 2005/0118799 | A1 | 6/2005 | Wu |
| 2005/0130405 | A1 | 6/2005 | Spencer et al. |

FOREIGN PATENT DOCUMENTS

| | | |
|---|---|---|
| EP | 0 709 355 | 5/1996 |
| EP | 0 738 788 A2 | 10/1996 |
| EP | 0 780 490 A1 | 6/1997 |
| JP | 21-48835 | 6/1990 |
| JP | 60-27690 | 2/1994 |
| JP | 07-29827 | 1/1995 |
| JP | 11-297681 | 10/1999 |

* cited by examiner

IN-SITU OXIDE CAPPING AFTER CVD LOW K DEPOSITION

BACKGROUND OF THE INVENTION

1. Field of the Invention

Embodiments of the present invention generally relate to the fabrication of integrated circuits. More particularly, embodiments of the present invention relate to a method and apparatus for processing a substrate that includes depositing an oxide rich cap on a low dielectric constant film.

2. Description of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.13 µm and even 0.1 µm feature sizes, and tomorrow's plants soon will be producing devices having even smaller geometries.

In order to further reduce the size of devices on integrated circuits, it has become necessary to use conductive materials having low resistivity and to use insulators having low dielectric constants (k<4) to reduce the capacitive coupling between adjacent metal lines. Recent developments in low dielectric constant films have focused on incorporating silicon (Si), carbon (C), and oxygen (O) atoms into the deposited films.

The development of Si, C, and O containing films that have a very low dielectric constant as well as desirable thermal and mechanical properties has been challenging. Often, films made of a Si, C, and O network that have a dielectric constant less than 2.5 exhibit poor mechanical strength and are easily damaged by etch chemistry and subsequent plasma exposure, such as exposure to oxygen-containing plasmas, causing failure of the integrated circuit.

It has also been observed that very low dielectric constant films comprising silicon, carbon, and oxygen often have a hydrophobic surface that hinders the deposition of subsequent films on the surface of the low dielectric constant films and reduces the adhesion of the low dielectric constant films to subsequently deposited films.

Thus, there remains a need for a method of depositing low dielectric constant films with improved surface characteristics.

SUMMARY OF THE INVENTION

The present invention generally provides a method of processing a substrate, comprising flowing one or more organosilicon compounds and one or more oxidizing gases into a chamber, depositing a low dielectric constant film comprising silicon, carbon, and oxygen on a substrate in the chamber in the presence of RF power, increasing a total flow rate of the one or more oxidizing gases into the chamber, decreasing a total flow rate of the one or more organosilicon compounds into the chamber, and depositing an oxide rich cap on the low dielectric constant film in the chamber in the presence of RF power.

In another embodiment, a method of processing a substrate comprises flowing an organosilicon compound and an oxidizing gas into a chamber, depositing a low dielectric constant film comprising silicon, carbon, and oxygen on a substrate in the chamber in the presence of RF power at a first power level, increasing a flow rate of the oxidizing gas into the chamber, decreasing a flow rate of the organosilicon compound into the chamber, and depositing an oxide rich cap on the low dielectric constant film in the chamber in the presence of the RF power at the first power level.

In a further embodiment, a method of processing a substrate comprises flowing an organosilicon compound, an oxidizing gas, and a carrier gas into a chamber, depositing a low dielectric constant film comprising silicon, carbon, and oxygen on a substrate in the chamber in the presence of RF power, decreasing the percent volume of the oxidizing gas in the chamber, decreasing the percent volume of the organosilicon compound in the chamber, increasing the percent volume of the carrier gas in the chamber, and depositing an oxide rich cap on the low dielectric constant film in the chamber in the presence of RF power.

In another embodiment, a substrate processing system is provided, wherein the substrate processing system comprises a gas panel comprising a first precursor source fluidly connected to a first vaporizer and a second precursor source fluidly connected to a second vaporizer, a chemical vapor deposition chamber comprising a heated gas feedthrough comprising a wall defining a feedthrough hole, and a line fluidly connecting the first vaporizer and the second vaporizer to the chemical vapor deposition chamber, wherein the line is configured to heat a fluid passing therethrough.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention provide a method of depositing a low dielectric constant film on a substrate and an oxide rich cap on the low dielectric constant film. The low dielectric constant film comprises silicon, carbon, and oxygen. In one aspect, the low dielectric constant film is an organosilicate layer and has a dielectric constant of about 3 or less. As defined herein, an "oxide rich cap" is a film having a higher oxygen content than the low dielectric constant film on which it is deposited. The oxide rich cap is deposited from a gas mixture having the same components as the gas mixture used to deposit the low dielectric constant film and also includes silicon and carbon.

Figure 1:
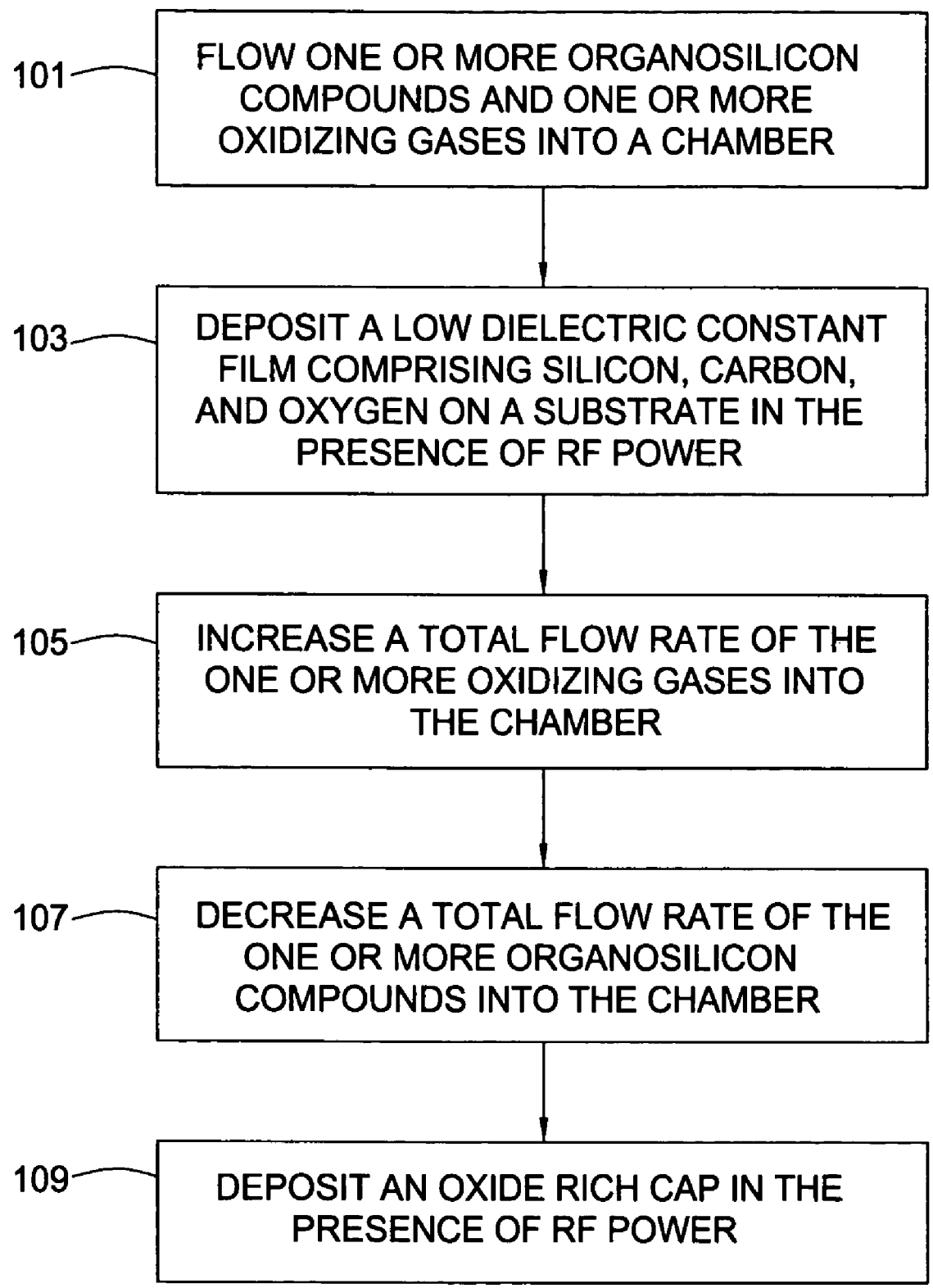
FIG. 1 is a process flow diagram illustrating a method incorporating an embodiment of the invention.

FIG. 1 is a process flow diagram summarizing an embodiment of the invention. In step 101, one or more organosilicon compounds and one or more oxidizing gases are flowed into a chamber. In step 103, a low dielectric constant film comprising silicon, carbon, and oxygen is deposited on a substrate in the chamber from a mixture of the one or more organosilicon compounds and the one or more oxidizing gases in the presence of RF power. In step 105, a total flow rate of the one or more oxidizing gases into the chamber is increased. In step 107, a total flow rate of the one or more organosilicon compounds into the chamber is decreased. In step 109, an oxide rich cap is deposited on the low dielectric constant film in the presence of RF power. As the oxide rich cap is deposited immediately after the deposition of the low dielectric constant film in the same chamber from the same gases, there is not a sharp interface between the low dielectric constant film and the oxide rich cap. Instead, there is an oxygen concentration gradient between the low dielectric constant film and the oxide rich cap.

The one or more organosilicon compounds used to deposit the low dielectric constant film may be an organosiloxane, an organosilane, or a combination thereof. The term "organosilicon compound" as used herein is intended to refer to compounds containing carbon atoms in organic groups, and can be cyclic or linear. Organic groups may include alkyl, alkenyl, cyclohexenyl, and aryl groups in addition to functional derivatives thereof. Preferably, the organosilicon compounds include one or more carbon atoms attached to a silicon atom such that the carbon atoms are not readily removed by oxidation at suitable processing conditions. The organosilicon compounds may also preferably include one or more oxygen atoms.

Suitable cyclic organosilicon compounds include a ring structure having three or more silicon atoms, and optionally one or more oxygen atoms. Commercially available cyclic organosilicon compounds include rings having alternating silicon and oxygen atoms with one or two alkyl groups bonded to the silicon atoms. Some exemplary cyclic organosilicon compounds include:

| | |
|---|---|
| 1,3,5-trisilano-2,4,6-trimethylene, | —(—SiH$_2$CH$_2$—)$_3$-(cyclic) |
| 1,3,5,7-tetramethylcyclotetrasiloxane(TMCTS), | —(—SiHCH$_3$—O—)$_4$-(cyclic) |
| octamethylcyclotetrasiloxane (OMCTS), | —(—Si(CH$_3$)$_2$—O—)$_4$-(cyclic) |
| 1,3,5,7,9-pentamethylcyclopentasiloxane, | —(—SiHCH$_3$—O—)$_5$-(cyclic) |
| 1,3,5,7-tetrasilano-2,6-dioxy-4,8-dimethylene, | —(—SiH$_2$—CH$_2$—SiH$_2$—O—)$_2$-(cyclic) |
| hexamethylcyclotrisiloxane, | —(—Si(CH$_3$)$_2$—O—)$_3$-(cyclic). |

Suitable linear organosilicon compounds include aliphatic organosilicon compounds having linear or branched structures with one or more silicon atoms and one or more carbon atoms. The organosilicon compounds may further include one or more oxygen atoms. Some exemplary linear organosilicon compounds include:

| | |
|---|---|
| methylsilane, | CH$_3$—SiH$_3$ |
| dimethylsilane, | (CH$_3$)$_2$—SiH$_2$ |
| trimethylsilane, | (CH$_3$)$_3$—SiH |
| ethylsilane, | CH$_3$—CH$_2$—SiH$_3$ |
| disilanomethane, | SiH$_3$—CH$_2$—SiH$_3$ |
| bis(methylsilano)methane, | CH$_3$—SiH$_2$—CH$_2$—SiH$_2$—CH$_3$ |
| 1,2-disilanoethane, | SiH$_3$—CH$_2$—CH$_2$—SiH$_3$ |
| 1,2-bis(methylsilano)ethane, | CH$_3$—SiH$_2$—CH$_2$—CH$_2$—SiH$_2$—CH$_3$ |
| 2,2-disilanopropane, | SiH$_3$—C(CH$_3$)$_2$—SiH$_3$ |
| diethylsilane, | (C$_2$H$_5$)$_2$—SiH$_2$ |
| propylsilane, | C$_3$H$_7$—SiH$_3$ |
| vinylmethylsilane, | (CH$_2$=CH)—SiH$_2$—CH$_3$ |
| 1,1,2,2-tetramethyldisilane, | (CH$_3$)$_2$—SiH—SiH—(CH$_3$)$_2$ |
| hexamethyldisilane, | (CH$_3$)$_3$—Si—Si—(CH$_3$)$_3$ |
| 1,1,2,2,3,3-hexamethyltrisilane, | (CH$_3$)$_2$—SiH—Si(CH$_3$)$_2$—SiH—(CH$_3$)$_2$ |
| 1,1,2,3,3-pentamethyltrisilane, | (CH$_3$)$_2$—SiH—SiH(CH$_3$)—SiH—(CH$_3$)$_2$ |
| 1,3-bis(methylsilano)propane, | CH$_3$—SiH$_2$—(CH$_2$)$_3$—SiH$_2$—CH$_3$ |
| 1,2-bis(dimethylsilano)ethane, | (CH$_3$)$_2$—SiH—(CH$_2$)$_2$—SiH—(CH$_3$)$_2$ |
| 1,3-bis(dimethylsilano)propane, | (CH$_3$)$_2$—SiH—(CH$_2$)$_3$—SiH—(CH$_3$)$_2$ |

| -continued | |
|---|---|
| methyldiethoxysilane (MDEOS), | $CH_3-SiH-(O-CH_2-CH_3)_2$ |
| 1,3-dimethyldisiloxane, | $CH_3-SiH_2-O-SiH_2-CH_3$ |
| 1,1,3,3-tetramethyldisiloxane, | $(CH_3)_2-SiH-O-SiH-(CH_3)_2$ |
| hexamethyldisiloxane (HMDS), | $(CH_3)_3-Si-O-Si-(CH_3)_3$ |
| 1,3-bis(silanomethylene)disiloxane, | $(SiH_3-CH_2-SiH_2-)_2-O$ |
| bis(1-methyldisiloxanyl)methane, | $(CH_3-SiH_2-O-SiH_2-)_2-CH_2$ |
| 2,2-bis(1-methyldisiloxanyl)propane, | $(CH_3-SiH_2-O-SiH_2-)_2-C(CH_3)_2$ |
| dimethyldimethoxysilane (DMDMOS), | $(CH_3O)_2-Si-(CH_3)_2$ |
| dimethoxymethylvinylsilane (DMMVS), | $(CH_3O)_2-Si(CH_3)-CH_2=CH_3$ |
| phenyldimethoxysilane, | $C_6H_5-SiH-(O-CH_3)_2$ |
| diphenylmethylsilane, | $(C_6H_5)_2-SiH-CH_3$ |
| dimethylphenylsilane, | $(CH_3)_2-SiH-C_6H_5$. |

A preferred cyclic organosiloxane is octamethylcyclotetrasiloxane (OMCTS), and a preferred linear organosilane is trimethylsilane.

Oxidizing gases that may be used include oxygen ($O_2$), ozone ($O_3$), nitrous oxide ($N_2O$), carbon monoxide (CO), carbon dioxide ($CO_2$), water ($H_2O$), 2,3-butane dione, or combinations thereof. When ozone is used as an oxidizing gas, an ozone generator converts from 6% to 20%, typically about 15%, by weight of the oxygen in a source gas to ozone, with the remainder typically being oxygen. However, the ozone concentration may be increased or decreased based upon the amount of ozone desired and the type of ozone generating equipment used. Disassociation of oxygen or the oxygen containing compounds may occur in a microwave chamber prior to entering the deposition chamber to reduce excessive dissociation of the silicon containing compounds.

One or more carrier gases may be introduced into the chamber in addition to the one or more organosilicon compounds and the one or more oxidizing gases. Carrier gases that may be used include inert gases such as argon, helium, and combinations thereof.

In one embodiment, one organosilicon compound, one oxidizing gas, and one carrier gas are used to deposit the low dielectric constant film. In other embodiments, a mixture of one or more organosilicon compounds, one or more oxidizing gases, and one or more carrier gases may be used to deposit the low dielectric constant film.

Optionally, one or more hydrocarbon compounds may be used in depositing the low dielectric constant film. For example, in one embodiment, a low dielectric constant film is deposited from a gas mixture comprising a cyclic organosilicon compound, one or more aliphatic compounds, and one or more oxidizing gases. The one or more aliphatic compounds may include an aliphatic organosilicon compound, an aliphatic hydrocarbon, or a mixture thereof. In one embodiment, the gas mixture comprises octamethylcyclotetrasiloxane, trimethylsilane, ethylene, and oxygen. Further description of the deposition of a low dielectric constant film from such a gas mixture is provided in U.S. patent application Ser. No. 10/121,284, filed Apr. 11, 2002, which is commonly assigned and is incorporated by reference herein.

In another embodiment, a low dielectric constant film is deposited from a gas mixture including one or more organosilicon compounds, one or more hydrocarbon compounds having at least one cyclic group, and one or more oxidizing gases. For example, the gas mixture may include diethoxymethylsilane, alpha-terpinene, oxygen, and carbon dioxide.

Following deposition of the low dielectric constant film, the film may be cured such as with an electron beam treatment to remove pendant organic groups, such as the cyclic groups of the hydrocarbon compounds that have been incorporated into the film network, to create pores in the low dielectric constant film. Further description of the deposition of a low dielectric constant film deposited from such a gas mixture is provided in U.S. patent application Ser. No. 10/302,393, filed Nov. 22, 2002, which is commonly assigned and is incorporated by reference herein.

Hydrocarbon compounds that may be used include aliphatic hydrocarbon compounds having between one and about 20 adjacent carbon atoms. The hydrocarbon compounds can include adjacent carbon atoms that are bonded by any combination of single, double, and triple bonds. For example, the hydrocarbon compounds may include alkenes and alkylenes having two to about 20 carbon atoms, such as ethylene, propylene, acetylene, and butadiene.

One or more hydrocarbon compounds having a cyclic group may also be used. The term "cyclic group" as used herein is intended to refer to a ring structure. The ring structure may contain as few as three atoms. The atoms may include carbon, silicon, nitrogen, oxygen, fluorine, and combinations thereof, for example. The cyclic group may include one or more single bonds, double bonds, triple bonds, and any combination thereof. For example, a cyclic group may include one or more aromatics, aryls, phenyls, cyclohexanes, cyclohexadienes, cycloheptadienes, and combinations thereof. The cyclic group may also be bi-cyclic or tri-cyclic. Further, the cyclic group is preferably bonded to a linear or branched functional group. The linear or branched functional group preferably contains an alkyl or vinyl alkyl group and has between one and twenty carbon atoms. The linear or branched functional group may also include oxygen atoms, such as in a ketone, ether, and ester. Some exemplary compounds having at least one cyclic group include alpha-terpinene (ATP), vinylcyclohexane (VCH), and phenylacetate.

Figure 2:
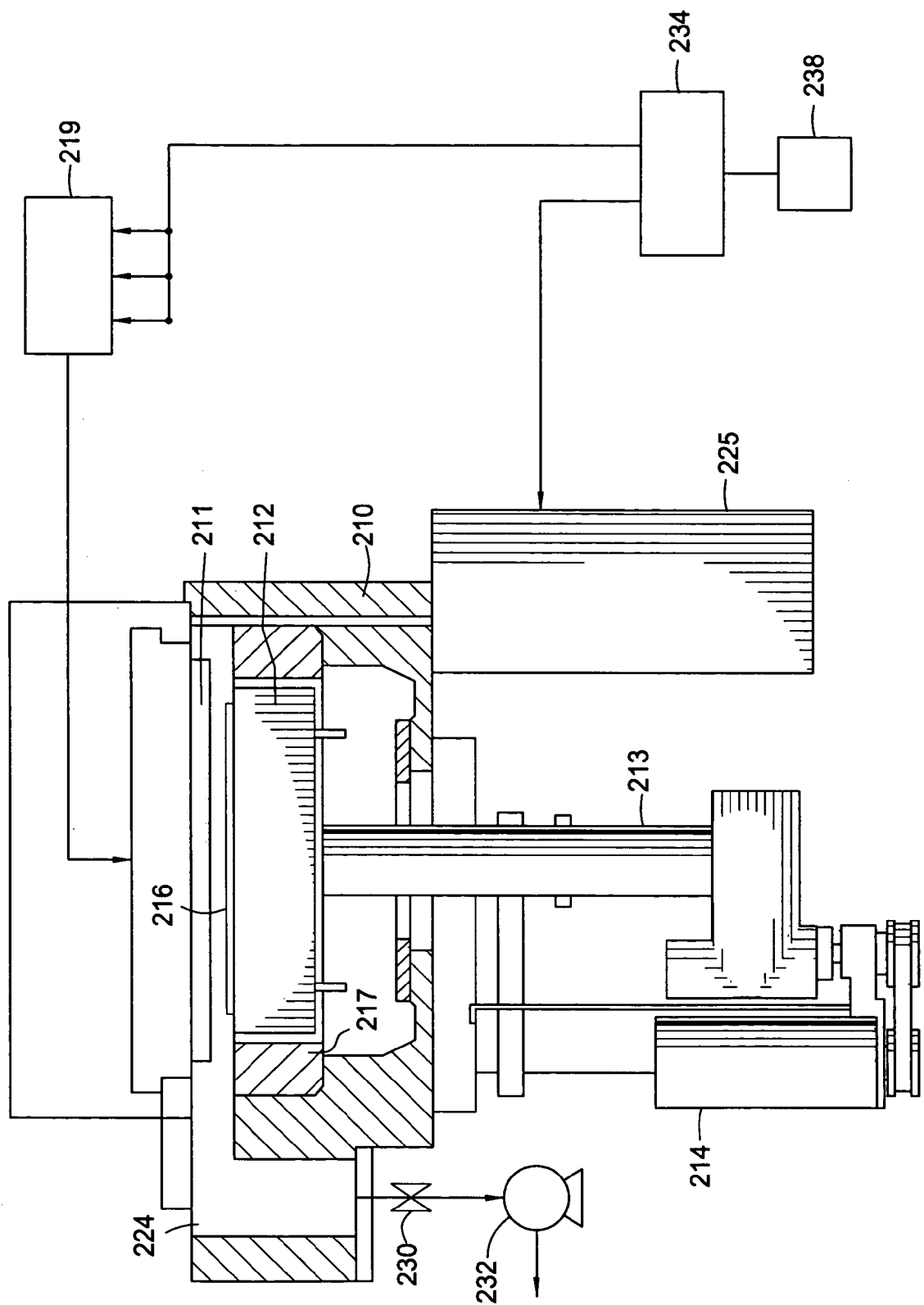
FIG. 2 is a cross-sectional diagram of an exemplary processing chamber that may be used for practicing embodiments of the invention.

FIG. 2 is a cross-sectional schematic view of a chemical vapor deposition (CVD) chamber 210 that is suitable for practicing embodiments of the invention. One example of such a chamber 210 is a DxZ® chamber used with a CENTURA® platform or in a PRODUCER® system (with dual chambers), all of which are available from Applied Materials, Inc., of Santa Clara, Calif.

The process chamber 210 contains a gas distribution manifold 211, typically referred to as a "showerhead", for dispersing process gases through perforated holes (not shown) in the manifold 211 to a substrate 216 that rests on a substrate support 212. Gas flow controllers 219 are typically used to control and regulate the flow rates of different process gases into the process chamber 210 through the gas distribution manifold 211. Other flow control components may include a liquid flow injection valve and liquid flow controller (not shown) if liquid precursors are used. The substrate support 212 is resistively heated and is mounted on a support stem 213, so that the substrate support 212 and the substrate 216 can be controllably moved by a lift motor 214 between a lower loading/off-loading position and an upper processing position adjacent to the gas distribution manifold 211. When the substrate support 212 and the substrate 216 are in a processing position, they are surrounded by an insulator ring 217.

During processing, process gases are uniformly distributed radially across the substrate surface. The gases are exhausted through a port 224 by a vacuum pump system 232, with the gas throughput or chamber pressure being regulated by a throttle valve 230. A plasma is formed from one or more process gases or a gas mixture by applying radio-frequency (RF) energy from a RF power supply 225 to the gas distribution manifold 211, which acts as an electrode. Alternatively or additionally, RF power can be provided to the substrate support 212. The RF power to the chamber may be cycled or pulsed to reduce heating of the substrate and promote greater porosity in the deposited film. Film deposition takes place when the substrate 216 is exposed to the plasma and the reactive gases provided therein. The substrate support 212 and chamber walls are typically grounded. The RF power supply 225 can supply either a single or mixed-frequency RF signal to the gas distribution manifold 211 to enhance the decomposition of any gases introduced into the chamber 210. When a single frequency RF signal is used, e.g., between about 350 kHz and about 60 MHz, a power between about 1 and about 2,000 W can be applied to the gas distribution manifold 211. In one aspect, the mixed frequency is a lower frequency of about 350 kHz and a higher frequency of about 13.56 MHz. In another aspect, the lower frequency may range between about 300 Hz to about 1,000 kHz, and the higher frequency may range between about 5 MHz and about 50 MHz.

A system controller 234 controls the functions of various components such as the power supplies, lift motors, flow controllers for gas injection, vacuum pumps, and other associated chamber and/or processing functions. The system controller 234 executes system control software stored in a memory 238, which in the preferred embodiment is a hard disk drive, and can include analog and digital input/output boards, interface boards, and stepper motor controller boards. Optical and/or magnetic sensors are generally used to move and determine the position of movable mechanical assemblies. An example of such a CVD process chamber is described in U.S. Pat. No. 5,000,113, entitled "Thermal CVD/PECVD Reactor and Use for Thermal Chemical Vapor Deposition of Silicon Dioxide and In-situ Multi-step Planarized Process," issued to Wang et al. and assigned to Applied Materials, Inc., the assignee of the present invention. The disclosure of this patent is incorporated herein by reference.

The above CVD system description is mainly for illustrative purposes, and other plasma processing chambers may also be employed for practicing embodiments of the invention.

Any of the embodiments described herein, and in particular, in embodiments in which a low dielectric constant film is deposited from a gas mixture comprising an organosilicon compound and a hydrocarbon having at least one cyclic group may include the use of an apparatus comprising a gas panel configured to vaporize and mix two or more liquid precursors, such as an organosilicon compound, e.g., methyldiethoxysilane (MDEOS), and a hydrocarbon having at least one cyclic group, e.g., alpha-terpinene (ATP), and a feedthrough configured to heat the mixed, vaporizer precursors as they are delivered through a chamber body of a deposition chamber to a processing region in the deposition chamber.

Figure 3:
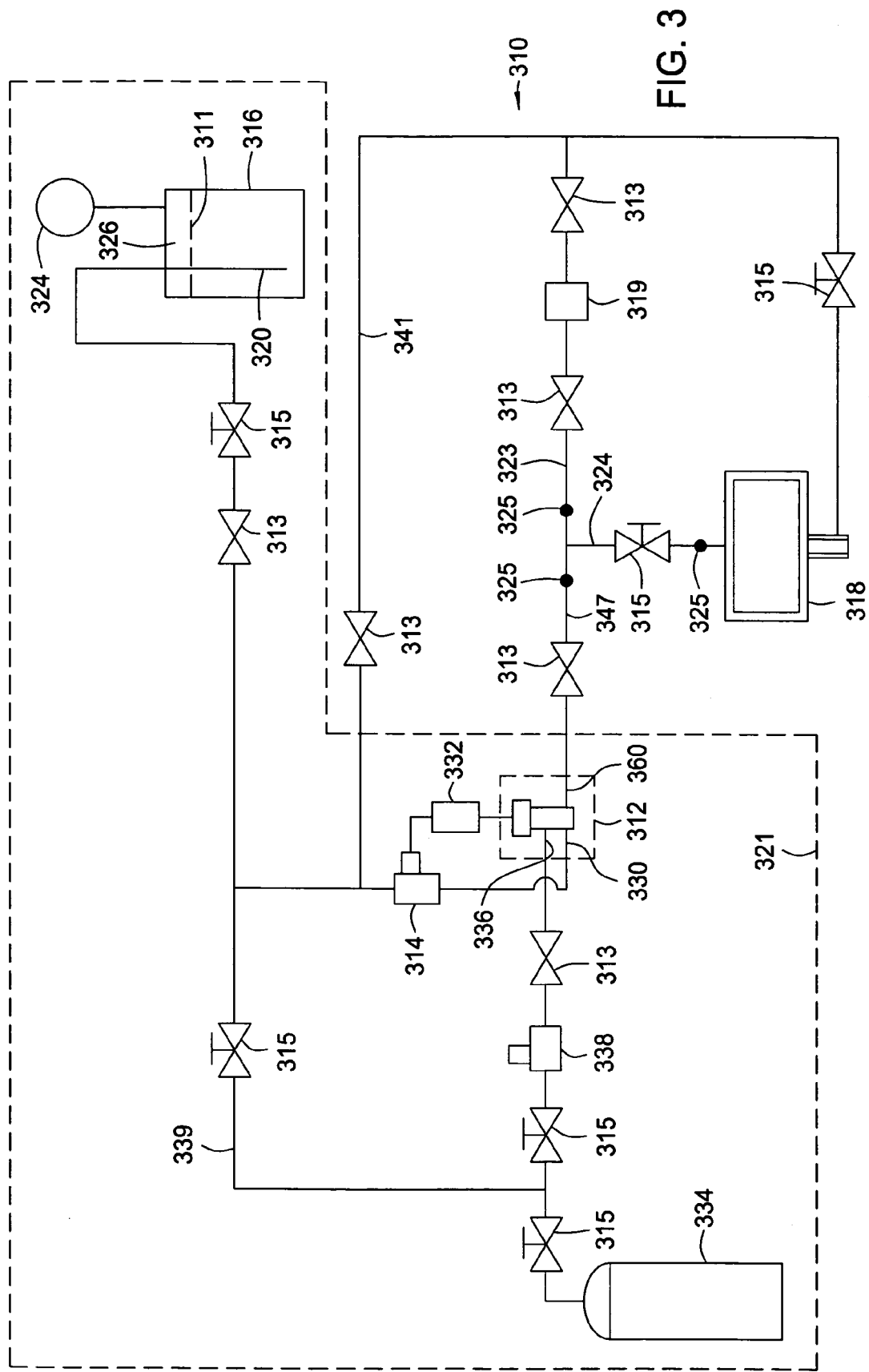
FIG. 3 is a block diagram of a gas panel attached to a chamber according to an embodiment of the invention.

FIG. 3 shows a gas panel 310 which uses a vaporizer 312 for both liquid flow control and vaporization at a single stage. Liquid flow rate is controlled by a closed loop system between a liquid flow monitor 314 and the vaporizer. In the gas panel 310, a liquid reactant 311, such as methyldiethoxysilane (MDEOS), alpha-terpinene (ATP), trimethylsilane, or the like is delivered from a liquid bulk delivery tank 316 to a CVD chamber 318. For example, such a CVD chamber 318 is described in commonly owned issued U.S. Pat. No. 5,855,681, the disclosure of which is incorporated by reference herein. The chamber described in U.S. Pat. No. 5,855,681 is an example of a PRODUCER® chamber.

The liquid bulk delivery tank 316 has a dip tube 320 extending into the tank 316 and a source 324 providing a pressurized gas such as helium to "head" space 326 at the top of tank 316, above the liquid reactant 311, for driving the liquid from the tank. The liquid flow monitor 314 is connected between the liquid bulk delivery tank 316 and liquid inlet 330 of the vaporizer 312. A controlled amount of liquid is injected by the vaporizer 312, which converts the liquid to vapor by expansion and transports the vapor to the CVD chamber 318 by means of a carrier gas, such as helium, nitrogen, or argon. A control signal from the liquid flow monitor 314 is fed back via control electronics 332 to the liquid flow control input of vaporizer 312. A gas tank 334 containing the carrier gas is connected to gas inlet 336 of the vaporizer 312 through a mass flow controller 338 which regulates the gas flow rate.

To facilitate servicing of the gas panel 310 and its component valves and other elements, a purge line 339 is connected between the gas tank 334 and the liquid flow monitor 314 to allow the operator to purge gas panel 310 of the reactant liquid 311 and its vapor before servicing. To further reduce the amount of reactant in the system, a vacuum line 341 is used in conjunction with purge line 339 to evacuate liquid and vapor from the system. Vacuum line 341 is coupled to the vacuum system (not shown) of the CVD process chamber.

Remotely controllable (e.g., pneumatic) valves 313 and manual valves 315 are inserted on each line. These valves are opened and closed to enable normal operation and purge and evacuation operations. To enhance safety and fault-tolerance, each line having a remotely controlled valve 313 also has a manual valve 315 which can be closed manually if the remotely controlled valve fails.

Gas panel 310 also includes component 319. Component 319 includes a set of all of the elements within dashed box 321 of FIG. 3. For example, component 319 includes a liquid bulk delivery tank for another precursor, such as alpha-terpinene, and a vaporizer for vaporizing the liquid from the liquid bulk delivery tank.

Vaporized precursor from the vaporizer 312 is delivered from outlet 360 to line 347 and then to line 324, which delivers the vaporized precursor into the CVD chamber 318. Vaporized precursor from the vaporizer of component 319 is delivered via line 323 to line 324 which delivers the vaporized precursor into the CVD chamber 318. While FIG. 3 shows a heater 325 on each of lines 347, 323, and 324, one or more of lines 347, 323, and 324 may have a heater thereon. An example of a heater that may be used is a Stretch-To-Length™ (S-T-L) gas line heater available from Watlow Electric Manufacturing Company of Columbia, Mo.

Further details of the gas panel 310 are provided in commonly assigned U.S. Pat. No. 6,224,681, which is incorporated by reference herein.

After the mixed vaporized precursors are introduced into CVD chamber 318, the mixed vaporized precursors are delivered to a gas distribution manifold (not shown) that introduces the mixed vaporized precursors into the processing region of the chamber. The mixed vaporized precursors are delivered to the gas distribution manifold through a heated gas feedthrough.

Figures 4, 4A:
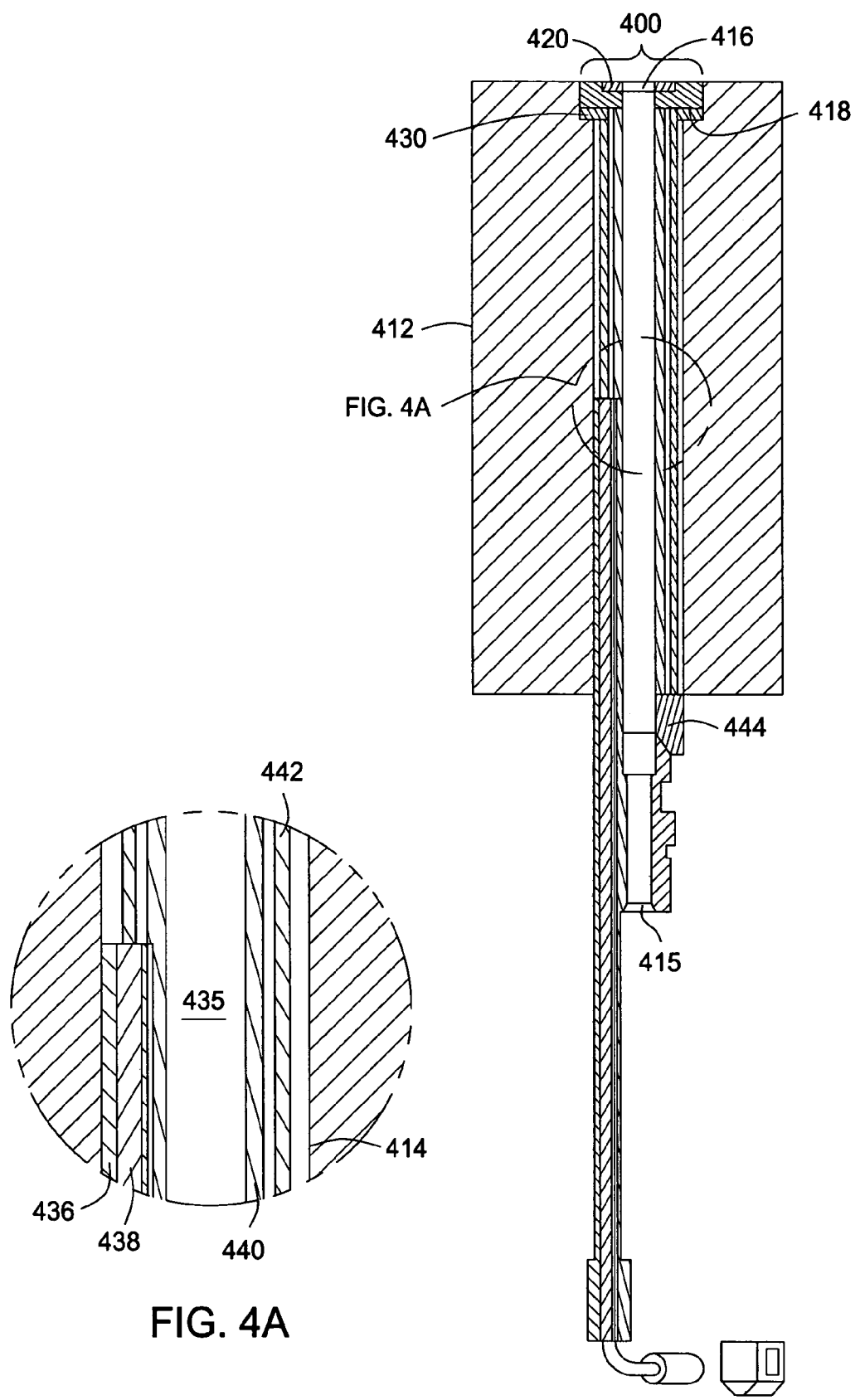
FIG. 4 is a cross sectional view of a heated gas feedthrough according to an embodiment of the invention.
FIG. 4A is an expanded view of a section of FIG. 4.

FIG. 4 is a cross sectional view showing a heated gas feedthrough 400. FIG. 4A is an expanded view of a portion of FIG. 4. The heated gas feedthrough 400 is configured to heat a fluid, such as a vaporized precursor, passing therethrough. A chamber body 412 defines a passage 414 for receiving the heated gas feedthrough 400 that has an inlet 415 to receive precursors from a gas panel and an outlet 416 to deliver the precursors to the gas distribution manifold. A seal 420, such as a O-ring seal, is located around the outlet 416 to provide a sealing connection between the heated gas feedthrough 400 and the gas distribution manifold. The passage 414 includes a shoulder 418 disposed on the upper end of the passage 414 and includes a seal 430, such as an O-ring seal, between the shoulder 418 and the chamber body 412.

The heated gas feedthrough 400 has a feedthrough hole 435 defined in wall 440. A heater jacket 442 surrounds the wall 440. In one embodiment, the heater jacket 442 comprises heating tape. In another embodiment, the heater jacket comprises a cable type heater as shown in FIG. 3A of U.S. Pat. No. 6,527,865 and in FIG. 3A of U.S. Pat. No. 6,056,223. The heated gas feedthroughs shown and described in commonly owned U.S. Pat. No. 6,527,865 and in commonly owned U.S. Pat. No. 6,056,223, which are herein incorporated by reference, may be used in embodiments of the invention.

Returning to FIGS. 4–4A, a lead wire 436 extends from the lower end of the heated gas feedthrough 400 and is connected to a power source to heat the feedthrough. A thermocouple 438 is disposed adjacent the wall 440 to monitor the temperature of the heated gas feedthrough 400. The lead wire 436 and the thermocouple 438 are mounted in the passage 414 and are secured therein by retaining ring 444. The temperature of the heated gas feedthrough is controlled by a feedback loop (not shown) that receives input from the thermocouple 438. The heated gas feedthrough may be maintained at a set temperature up to about 160° C. As the temperature of the heated gas feedthrough 400 may be maintained at a constant or substantially constant temperature, condensation of the vaporized precursors passing therethrough and/or decomposition of the vaporized precursors before they are introduced into the gas distribution manifold are minimized.

Returning to the deposition of the low dielectric constant film, although any of the gas mixtures described above may be used, for simplicity, chamber processing conditions will be described with respect to a preferred mixture comprising an organosilicon compound, an oxidizing gas, and a carrier gas. The organosilicon compound may be introduced into the chamber at a flow rate of about 5 sccm to about 5,000 sccm. The oxidizing gas has a flow rate between about 5 sccm and about 3,000 sccm. The carrier gas has a flow rate between about 50 sccm and about 2,500 sccm.

During deposition, the substrate is maintained at a temperature between about −20° C. and about 500° C., preferably between about 100° C. and about 450° C. The deposition pressure is typically between about 1 Torr and about 20 Torr, preferably between about 2.5 Torr and about 8.7 Torr. An RF power of between about 0.1 W/cm$^2$ and about 2.8 W/cm$^2$, e.g., between about 100 W and about 2,000 W for a 300 mm substrate, at a frequency of 13.56 MHz may be applied in the chamber. An RF power of between about 0.01 W/cm$^2$ and about 0.3 W/cm$^2$, e.g., between about 10 W and about 200 W for a 300 mm substrate, at a frequency of 350 kHz may also be applied in the chamber. The RF power forms a plasma in the chamber such that the low dielectric constant film is deposited by plasma enhanced chemical vapor deposition (PECVD).

Referring again to FIG. 1, in one embodiment, after the low dielectric constant film is deposited on a substrate in the chamber, a total flow rate of the one or more oxidizing gases into the chamber is increased, as shown in step 105. For example, a total flow rate of the one or more oxidizing gases may be increased to a flow rate of between about 250 sccm and about 1,000 sccm from a flow rate of between about 25 sccm and about 250 sccm used to deposit the low dielectric constant film on a 300 mm substrate. Also after the low dielectric constant film is deposited, a total flow rate of the one or more organosilicon compounds is decreased, as shown in step 107. For example, a total flow rate of the one or more organosilicon compounds may be decreased to a flow rate of between about 5 sccm and about 35 sccm from a flow rate of between about 50 sccm and about 1,500 sccm used to deposit the low dielectric constant film on a 300 mm substrate. The total flow rate of the one or more organosilicon compounds may be about 30% to about 300% of the total flow rate of the one or more oxidizing gases during the deposition of the low dielectric constant film, and the total flow rate of the one or more organosilicon compounds may be between about 5% and about 20% of the total flow rate of the one or more oxidizing gases during the deposition of the oxide rich cap.

While the increasing the total flow rate of the one or more oxidizing gases and the decreasing the total flow rate of the one or more organosilicon compounds are shown in FIG. 1 as being performed sequentially, they may be performed simultaneously or in either order. Preferably, the flow rates are adjusted simultaneously.

The flows of the one or more oxidizing gases and the flow of the one or more organosilicon compounds are maintained in the chamber for a period of time sufficient to deposit an oxide rich cap, e.g., a 20 Å to 2,000 Å cap, on the low dielectric constant film. The period of time may be between about 1 second and about 60 seconds and is preferably about 15 seconds.

During the deposition of the oxide rich cap, RF power may be maintained in the chamber at the same or substantially the same power level used to deposit the low dielectric constant film. Alternatively, different RF power levels may be used to deposit the low dielectric constant film and the oxide rich cap to tune the properties of the low dielectric constant film and the oxide rich cap.

In another embodiment, an organosilicon compound, an oxidizing gas, and a carrier gas are flowed into a chamber. A low dielectric constant film comprising silicon, carbon, and oxygen is deposited on a substrate in the chamber in the presence of RF power. After the deposition of the low dielectric constant film, the flows of the organosilicon compound, oxidizing gas, and carrier gas into the chamber are maintained to deposit an oxide rich cap on the low dielectric constant film in the presence of RE power. However, the percent volume of the oxidizing gas in the chamber is decreased, and the percent volume of the organosilicon compound in the chamber is decreased during the deposition of the oxide rich cap. The percent volume of the carrier gas in the chamber in increased. Preferably, the percent volumes of the oxidizing gas and the organosilicon compound are decreased and the percent volume of the carrier gas is increased simultaneously or substantially simultaneously. As defined herein, the percent volume of the oxidizing gas in the chamber is the flow rate of the oxidizing gas into the chamber at a given time divided by the total flow rate of gases into the chamber, i.e., the sum of the organosilicon compound, oxidizing gas, and carrier gas flow rates into the chamber, at the same given time. The percent volume of the organosilicon compound is typically decreased by a greater percentage than the percent volume of the oxidizing gas is decreased.

The flows of the organosilicon compound, oxidizing gas, and carrier gas are adjusted such that an oxide rich cap is deposited on the low dielectric constant film. In one embodiment, the flow of the oxidizing gas into the chamber is increased, the flow of the organosilicon compound into the chamber is decreased, and the flow of the carrier gas into the chamber is increased such that the percent volume of the oxidizing gas in the chamber decreases, the percent volume of the organosilicon compound in the chamber decreases, and the percent volume of the carrier gas in the chamber increases. Increasing the flow of the oxidizing gas into the chamber and decreasing the flow of the organosilicon compound into the chamber changes the ratio of the percent volume of the oxidizing gas in the chamber to the percent volume of the organosilicon compound in the chamber such that the percent volume of the oxidizing gas is increased relative to the percent volume of the organosilicon compound.

The flows of the one or more oxidizing gases and the flow of the one or more organosilicon compounds are maintained in the chamber for a period of time sufficient to deposit an oxide rich cap, e.g., a 20 Å to 2,000 Å cap, on the low dielectric constant film. The period of time may be between about 1 second and about 60 seconds and is preferably about 15 seconds.

During the deposition of the oxide rich cap, RF power may be maintained in the chamber at the same or substantially the same power level used to deposit the low dielectric constant film. Alternatively, different RF power levels may be used to deposit the low dielectric constant film and the oxide rich cap to tune the properties of the low dielectric constant film and the oxide rich cap.

The following example illustrates an embodiment of the present invention. The low dielectric constant film and the oxide rich cap was deposited using a chemical vapor deposition chamber that is part of an integrated processing platform. In particular, the films were deposited using a twin chamber on a 300 mm PRODUCER® SE system, available from Applied Materials, Inc. of Santa Clara, Calif. The twin chamber has two isolated processing regions (for processing two substrates, one substrate per processing region) such that the flow rates experienced in each region are approximately one half of the flow rates into the whole chamber. The flow rates described in the examples below and throughout the specification are the flow rates per one 300 mm substrate.

EXAMPLE 1

A low dielectric constant film was deposited on a substrate from the following gas mixture at a chamber pressure of 5 Torr and substrate temperature of 350° C.:
  Octamethylcyclotetrasiloxane (OMCTS), at about 110 sccm;
  Oxygen, at about 80 sccm; and
  Helium, at about 500 sccm.

The substrate was positioned 450 mils from the gas distribution manifold, and RF power of 0.7 W/cm$^2$ (500 W) at a frequency of 13.56 MHz and RF power of 0.2 W/cm$^2$ (150 W) at a frequency of 350 kHz were applied in the chamber. A low dielectric constant film comprising silicon, carbon, and oxygen was deposited on the substrate. The dielectric constant of the low dielectric constant film was 3.0±0.1. The low dielectric constant film was deposited at a rate of 7,000 Å/minute.

The gas flow rates were then adjusted as follows to deposit an oxide rich cap on the low dielectric constant film:
  Octamethylcyclotetrasiloxane (OMCTS), at about 19 sccm;
  Oxygen, at about 250 sccm; and
  Helium, at about 2,400 sccm.

The substrate was positioned 350 mils from the gas manifold. The pressure, temperature, and RF power were maintained at the same levels used during the deposition of the low dielectric constant film. The oxide rich cap was deposited at a rate of 1,620 Å/minute.

During the deposition of the oxide rich cap, the percent volume of the OMCTS in the chamber was 1% (19/[19+250+2400]), the percent volume of the oxygen in the chamber was 9%, and the percent volume of the helium in the chamber was 90%. The percent volume of the OMCTS was decreased from 16% during the deposition of the low dielectric constant film to 1% during the deposition of the oxide rich cap. The percent volume of the oxygen was decreased from 12% during the deposition of the low dielectric constant film to 9% during the deposition of the oxide rich cap. The percent volume of the helium was increased from 73% during the deposition of the low dielectric constant film to 90% during the deposition of the oxide rich cap.

While both the percent volume OMCTS and the percent volume oxygen decreased from the deposition of the low dielectric constant film to the deposition of the oxide rich cap, the percent volume of the OMCTS decreased to a greater extent (94%) than the percent volume that the oxygen decreased (25%). Thus, the ratio of the percent volume oxygen/percent volume OMCTS was increased from 0.75 (12%/16%) during the deposition of the low dielectric constant film to 9 (9%/1%) during the deposition of the oxide rich cap.

In another aspect, during the deposition of the low dielectric constant film, OMCTS was flowed into the chamber at 140% of the oxygen flow rate (110/80) into the chamber during the deposition of the low dielectric constant film, and OMCTS was flowed into the chamber at 8% of the oxygen flow rate (19/250) during the deposition of the oxide rich cap.

A low dielectric constant film deposited according to Example 1 without the deposition of an oxide rich cap thereon had a refractive index of 1.44, a uniformity of 2.5%, a tensile stress of 40 MPa, and a wetting angle of 90° for a subsequently deposited anti-reflective coating, such as a SiON, SiC, or SiCO film. An oxide rich cap deposited on a low dielectric constant film deposited according to Example 1 had a refractive index of 1.46, a uniformity of 2.0%, a compressive stress of −180 MPa, and a wetting angle of 42° for a subsequently deposited anti-reflective coating.

Example 1 illustrates that the oxide rich cap provides a lower wetting angle for a subsequently deposited layer than the wetting angle provided by the low dielectric constant film without the oxide rich cap. The oxide rich cap has a lower carbon content than the low dielectric constant film and thus is more hydrophilic than the low dielectric constant film. It is believed that the more hydrophilic surface of the oxide rich cap enhances the application and adhesion of an anti-reflective coating or other layers that are subsequently deposited on the oxide rich cap of the low dielectric constant film. It is further believed that the hydrophilic surface of the oxide rich cap enhances the application of slurries for chemical mechanical polishing (CMP) across the low dielectric constant film and thus promotes a more uniform CMP process.

The oxide rich cap also functions as a protective layer for the underlying low dielectric constant film. For example, the oxide rich cap may protect the underlying low dielectric constant film during subsequent processing steps, such as oxygen plasma processes that are often used to remove photoresists from substrates that may damage organosilicate films.

A minimal interface between the oxide rich cap and the low dielectric constant film is a further advantage of the method of depositing an oxide rich cap provided herein. The oxide rich cap described herein is deposited from the same precursors used for depositing the low dielectric constant film by adjusting the ratio of the precursors. The oxide rich cap is deposited immediately after the deposition of the low dielectric constant film in the same chamber without terminating the RF power used to deposit the low dielectric constant film. The in situ, i.e., in the same chamber, deposition of the oxide rich cap after the deposition of the low dielectric constant film provides an oxygen concentration gradient between the oxide rich cap and the low dielectric constant film such that there is not a sharp interface between the oxide rich cap and the low dielectric constant film that could create adhesion problems between the oxide rich cap and the low dielectric constant film. The in situ deposition of the oxide rich cap also reduces the number of processing steps required to form a cap on the low dielectric constant film, as the substrate does not have to be transferred to another chamber and prepared for another deposition sequence.

While the foregoing is directed to embodiments of the present invention, other and further embodiments of the invention may be devised without departing from the basic scope thereof, and the scope thereof is determined by the claims that follow.

What is claimed is:

1. A method of processing a substrate, comprising:
    flowing one or more organosilicon compounds and one or more oxidizing gases into a chamber;
    depositing a low dielectric constant film comprising silicon, carbon, and oxygen on a substrate in the chamber in the presence of RF power;
    increasing a total flow rate of the one of more oxidizing gases into the chamber after depositing the low dielectric constant film;
    decreasing a total flow rate of the one or more organosilicon compounds into the chamber after depositing the low dielectric constant film; and then
    depositing an oxide rich cap on the low dielectric constant film in the chamber in the presence of RF power, while maintaining the total flow rate of the one or more oxidizing gases and the total flow rate of the one or more organosilicon compounds.

2. The method of claim 1, wherein the one or more organosilicon compounds is an organosiloxane.

3. The method of claim 1, wherein the one or more organosilicon compounds is octamethylcyclotetrasiloxane or trimethylsilane.

4. The method of claim 1, wherein the one or more organosilicon compounds is octamethylcyclotetrasiloxane and the one or more oxidizing gases is oxygen.

5. The method of claim 1, further comprising flowing one or more carrier gases into the chamber.

6. The method of claim 1, wherein the one or more organosilicon compounds consists of one organosilicon compound and the one or more oxidizing gases consists of one oxidizing gas.

7. The method of claim 1, wherein the increasing a total flow rate of the one or more oxidizing gases comprises increasing the total flow rate of the one or more oxidizing gases from a flow rate of between about 25 sccm and about 250 sccm during the depositing a low dielectric constant film to a flow rate of between about 250 sccm and about 1,000 sccm during the depositing an oxide rich cap.

8. The method of claim 1, wherein the decreasing a total flow rate of the one or more organosilicon compounds comprises decreasing the total flow rate of the one or more organosilicon compounds from a flow rate of between about 50 sccm and about 1,500 sccm during the depositing a low dielectric constant film to a flow rate of between about 5 sccm and about 35 sccm during the depositing an oxide rich cap.

9. A method of processing a substrate, comprising: flowing an organosilicon compound, an oxidizing gas, and a carrier gas into a chamber;
    depositing a low dielectric constant film comprising silicon, carbon, and oxygen on a substrate in the chamber in the presence of RF power at a first power level;
    increasing a flow rate of the oxidizing gas into the chamber after depositing the low dielectric constant film and while maintaining the RF power in the chamber at the first power level;
    decreasing a flow rate of the organosilicon compound into the chamber after depositing the low dielectric constant film and while maintaining the RF power in the chamber at the first power level; and then
    depositing an oxide rich cap on the low dielectric constant film in the chamber in the presence of the RF power at the first power level immediately after the deposition of the low dielectric constant film.

10. The method of claim 9, further comprising depositing an anti-reflective coating on the oxide rich cap.

11. The method of claim 9, wherein the carrier gas is flowed into the chamber at a first rate during the depositing a low dielectric constant film and the carrier gas is flowed into the chamber at a second rate higher than the first rate during the depositing an oxide rich cap.

12. The method of claim 9, wherein the organosilicon compound is octamethylcyclotetrasiloxane and the oxidizing gas is oxygen.

13. The method of claim 9, wherein the RF power at a first power level comprises RE power of between about 0.1 $W/cm^2$ and about 2.8 $W/cm^2$ at 13.56 MHz.

14. The method of claim 13, wherein the RE power at a first power level further comprises RE power of between about 0.01 $W/cm^2$ and about 0.3 W/cm2 at 350 kHz.

15. A method of processing a substrate, comprising:
flowing an organosilicon compound, an oxidizing gas, and a carrier gas into a chamber;
depositing a low dielectric constant film comprising silicon, carbon, and oxygen on a substrate in the chamber in the presence of RF power;
decreasing the percent volume of the oxidizing gas in the chamber after depositing the low dielectric constant film;
decreasing the percent volume of the organosilicon compound in the chamber after depositing the low dielectric constant film;
increasing the percent volume of the carrier gas in the chamber after depositing the low dielectric constant film; and then
depositing an oxide rich cap on the low dielectric constant film in the chamber in the presence of the RF power.

16. The method of claim 15, wherein the percent volume of the organosilicon compound is decreased by a greater percentage than the percent volume of the oxidizing gas is decreased.

17. The method of claim 15, wherein the decreasing the percent volume of the oxidizing gas in the chamber and the decreasing the percent volume of the organosilicon compound in the chamber changes a ratio of the percent volume of the oxidizing gas in the chamber to the percent volume of the organosilicon compound in the chamber.

18. The method of claim 15, wherein the RE power comprises an RF power level of between about 0.1 W/cm$^2$ and about 2.8 W/cm$^2$ at 13.56 MHz and an RF power level of between about 0.01 W/cm$^2$ and about 0.3 W/cm$^2$ at 350 kHz.

19. The method of claim 15, further comprising depositing an anti-reflective coating on the oxide rich cap.

20. The method of claim 19, wherein the anti-reflective coating is a SiON, SiC, or SiCO film.

* * * * *

UNITED STATES PATENT AND TRADEMARK OFFICE
CERTIFICATE OF CORRECTION

PATENT NO. : 7,112,541 B2
APPLICATION NO. : 10/840754
DATED : May 6, 2004
INVENTOR(S) : Xia et al.

It is certified that error appears in the above-identified patent and that said Letters Patent is hereby corrected as shown below:

Column 4, Line 63: In the table, change "CH$_3$)$_3$—Si—Si—(CH$_3$)$_3$" to --(CH$_3$)$_3$—Si—Si—(Ch$_3$)$_3$--

Column 5, Line 12: In the table, change "(DMDM05)" to --(DMDMOS)--

Column 5, Line 19: In the table, change "dimethyiphenylsilane" to --dimethylphenylsilane--

Column 11, Line 3: Change "RE" to --RF--

Column 13, Claim 1, Line 60: Before "more", change "of" to --or--

Column 14, Claim 13, Line 63: Change "RE" to --RF--

Column 14, Claim 14, Line 66: Change "RE" to --RF--

Column 14, Claim 14, Line 67: Change "cm2" to --cm$^2$--

Column 16, Claim 18, Line 9: Change "RE" to --RF--

Signed and Sealed this

Twenty-sixth Day of December, 2006

JON W. DUDAS
*Director of the United States Patent and Trademark Office*

UNITED STATES PATENT AND TRADEMARK OFFICE
CERTIFICATE OF CORRECTION

PATENT NO.       : 7,112,541 B2
APPLICATION NO.  : 10/840754
DATED            : September 26, 2006
INVENTOR(S)      : Xia et al.

It is certified that error appears in the above-identified patent and that said Letters Patent is hereby corrected as shown below:

Column 4, Line 63: In the table, change "$CH_3)_3$—Si—Si—$(CH_3)_3$" to --$(CH_3)_3$—Si—Si—$(Ch_3)_3$--

Column 5, Line 12: In the table, change "(DMDM05)" to --(DMDMOS)--

Column 5, Line 19: In the table, change "dimethyiphenylsilane" to --dimethylphenylsilane--

Column 11, Line 3: Change "RE" to --RF--

Column 13, Claim 1, Line 60: Before "more", change "of" to --or--

Column 14, Claim 13, Line 63: Change "RE" to --RF--

Column 14, Claim 14, Line 66: Change "RE" to --RF--

Column 14, Claim 14, Line 67: Change "cm2" to --$cm^2$--

Column 16, Claim 18, Line 9: Change "RE" to --RF--

This certificate supersedes Certificate of Correction issued December 26, 2006.

Signed and Sealed this

Thirtieth Day of January, 2007

JON W. DUDAS
*Director of the United States Patent and Trademark Office*